United States Patent
Nakagawa et al.

[11] Patent Number: 5,935,324
[45] Date of Patent: Aug. 10, 1999

[54] APPARATUS AND METHOD FOR FORMING I-III-VI$_2$ THIN-FILM LAYERS

[75] Inventors: Shinnichi Nakagawa; Kenji Sato; Masami Nakamura; Kazuhiro Toyoda; Takeshi Kamiya; Kazue Suzuki; Hiroki Ishihara; Takeshi Ikeya; Masaharu Ishida, all of Shizuoka, Japan

[73] Assignee: Yazaki Corporation, Tokyo, Japan

[21] Appl. No.: 08/847,630

[22] Filed: Apr. 28, 1997

[30] Foreign Application Priority Data

Apr. 26, 1996 [JP] Japan ................................... 8-107607
Mar. 18, 1997 [JP] Japan ................................... 9-064699

[51] Int. Cl.$^6$ ......................... H01L 31/0264; B05D 5/12; C30B 23/06
[52] U.S. Cl. ........................... 117/106; 117/109; 427/74; 427/76; 438/95; 438/930; 136/264; 136/265
[58] Field of Search ..................... 136/264, 265; 427/74, 76; 438/95, 93; 117/95, 106, 109

[56] References Cited

FOREIGN PATENT DOCUMENTS 8-107227  4/1996  Japan ........................... H01L 31/04

Primary Examiner—Benjamin Utech
Assistant Examiner—Donald L. Champagne
Attorney, Agent, or Firm—Sughrue, Mion, Zinn, Macpeak & Seas, PLLC

[57] ABSTRACT

An apparatus for forming I-III-VI$_2$ thin-film layers has a reaction chamber made of a carbon material in which a precursor for forming a I-III-VI$_2$ thin-film layer and a vapor source of an element of group VI of the periodic table are placed. The precursor and vapor source are heated under vacuum to form the I-III-VI$_2$ thin-film layer. The reaction chamber is divided into a reaction compartment A having the precursor placed therein and a reaction compartment B having the vapor element of group IV placed therein. A communication channel C is provided between the reaction compartments A and B, and a heating unit controlled by a temperature control unit is provided exterior to each of the reaction compartments A and B.

4 Claims, 7 Drawing Sheets

PRIOR ART

APPARATUS AND METHOD FOR FORMING I-III-VI₂ THIN-FILM LAYERS

BACKGROUND OF THE INVENTION

The present invention relates to a method and an apparatus for forming thin-film layers of compound semiconductors of a I-III-VI$_2$ system for use in solar cells and the like.

Figure 4:
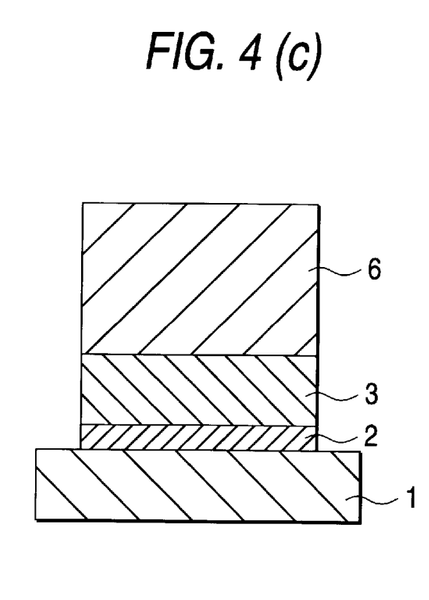
FIGS. 4(a) to 4(c) show in sections the principal steps of a conventional method for forming a CIS thin-film layer.

Compound semiconductors having a CIS (CuInSe$_2$) thin-film layer have been used as solar cells and are known per se. FIGS. 4a to 4c show in section the principal steps for forming the CIS thin-film layer. A method of forming the conventional CIS thin-film layer will now be described with reference to these figures. First, a glass substrate 1 is overlaid with a chromium (Cr) layer 2 and a molybdenum (Mo) layer 3 that are formed successively by sputtering (FIG. 4a); then, a copper (Cu) layer 4 (about 2,000 Å) and an elemental indium (In) layer or an In layer 5 (about 7,000 Å) made of In containing selenium (Se) colloid (10 atm %) are superposed successively by electroplating; the assembly is heated in argon to form a precursor 4–5 for forming a Cu-In-Se thin-film layer (FIG. 4b); the assembly is further heated in a selenium (Se) vapor atmosphere to form a CIS thin-film layer 6 (FIG. 4c). The Cu layer 4 and the In layer 5 may alternatively be superposed by evaporation. The Se vapor is generated from a Se vapor source, or by heating a solid Se to evaporate it.

Figure 7:
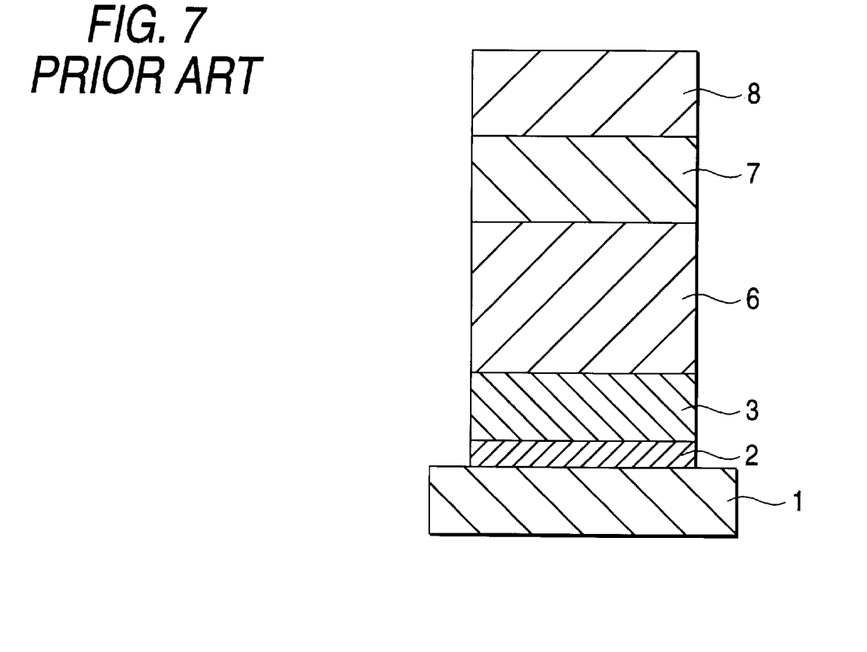
FIG. 7 shows in section the basic process of fabricating a solar cell from a CIS thin-film layer.

FIG. 7 shows in section the basic process of fabricating a solar cell from the conventional CIS thin-film layer. As shown, a CdS layer 7 is deposited on the CIS thin-film layer 6 by vacuum evaporation and, subsequently, a ZnO layer 8 is deposited on the CdS layer 7 by sputtering to thereby form a solar cell.

An apparatus (A) for forming the conventional CIS thin-film layer has been proposed in Japanese Patent Unexamined Publication No. Hei 8-107227. A closed space is formed between a lower heating jig and an upper heating jig, and the precursor and the solid Se (Se vapor source) are placed in the closed space and are heated to form a CIS-thin film layer in a Se vapor atmosphere.

Figure 5:
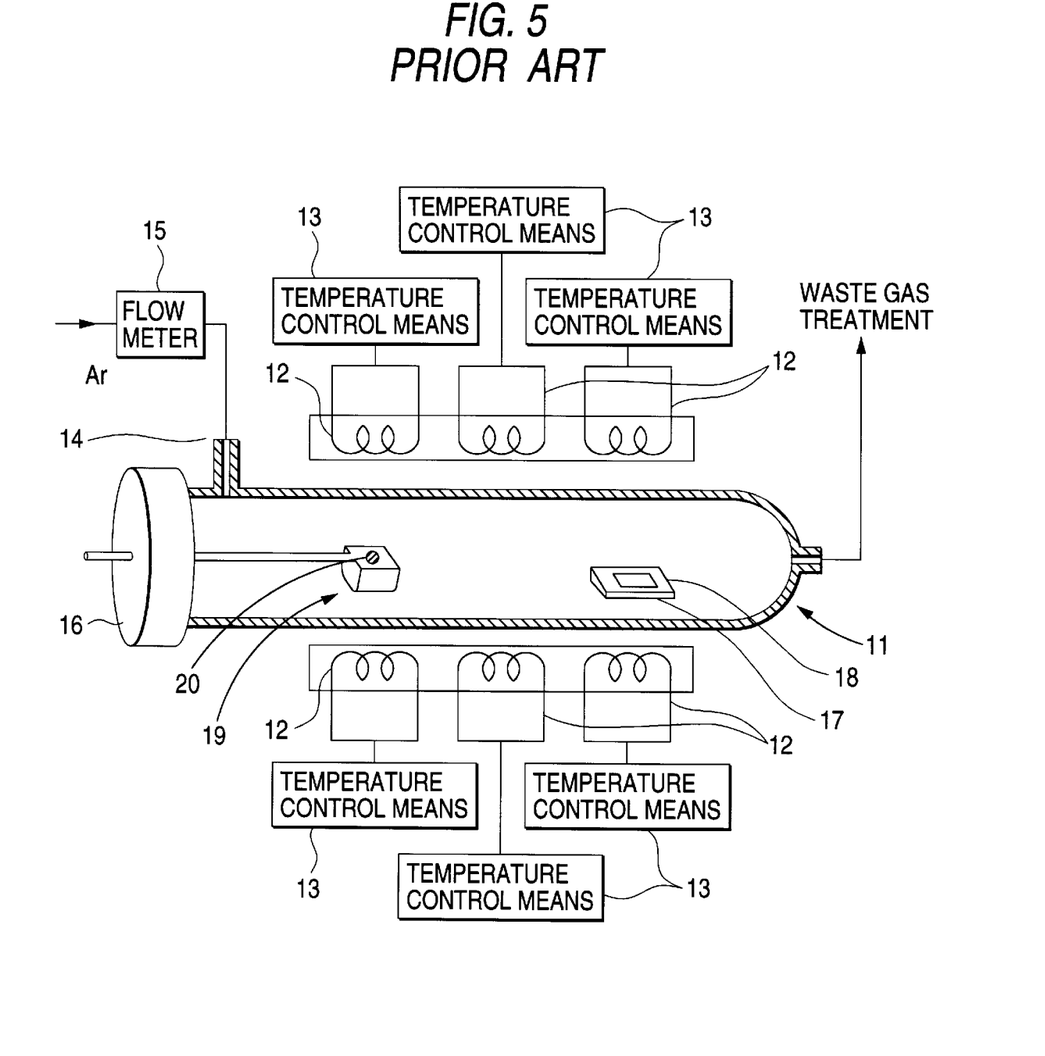
FIG. 5 shows schematically a conventional apparatus for forming a CIS thin-film layer.

Another apparatus (B) for forming the conventional CIS thin-film layer is shown in FIG. 5. This apparatus is basically composed of a reaction tube 11 and heating means 12 that is controlled by temperature control means 13. The reaction tube 11 has an Ar gas inlet 14 provided on top of a lateral side, with an exhaust port provided at the other end. Argon gas is introduced into the reaction tube 11 through a flow meter 15. The reaction tube 11 is also provided with a door 16 that can be opened such that a precursor 17 is brought into the tube and placed on a sample holder 18. The door 16 is fitted with a telescopic bar which in turn is provided with a vessel 19 at the distal end for holding a solid Se 20. The solid Se 20 is heated by the heating means 12 to form a gas atmosphere consisting of a mixture of the Ar gas and the Se vapor. In this mixed gas atmosphere, Se is introduced into the precursor to form a mixed crystal and, hence, the intended CIS thin-film layer. The exhaust gas is discharged from the exhaust port and subjected to a waste treatment.

Figure 6:
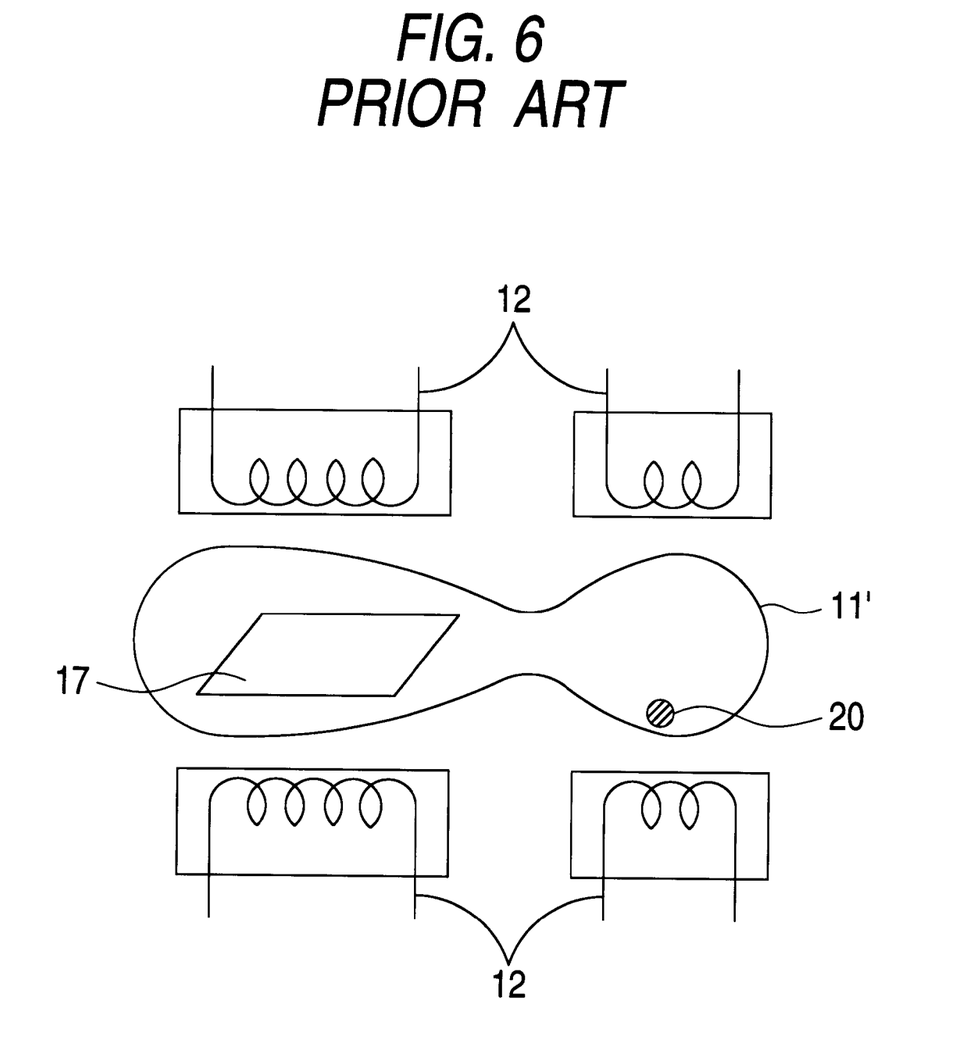
FIG. 6 shows schematically another conventional apparatus for forming a CIS thin-film layer.

Yet another apparatus (C) for forming the conventional CIS thin-film layer is shown in FIG. 6. This apparatus is basically composed of a closed ampule 11' in the form of a quartz tube and heating means 12, and its principal use is in the laboratory. The solid Se 20 is heated by the heating means 12 to form a Se vapor atmosphere, in which Se is introduced into a layered structure 17 having a precursor to form a mixed crystal and, hence, the intended CIS thin-film layer.

In the conventional apparatus (A) for forming the CIS thin-film layer, both the precursor and the solid Se are heated as they are placed within the closed space maintained under vacuum and, hence, the desired selenization reaction can be adequately accelerated within the generated high-pressure Se vapor atmosphere; on the other hand, the precursor cannot be selenized and sulfurized either simultaneously or separately within the same vacuum atmosphere.

The apparatus (B) for forming the conventional CIS thin-film layer has had the following problems: i) after the selenization reaction, a large amount of the unreacted Se has to be discarded; ii) as a result, a large amount of solid Se has to be employed; iii) vacuum cannot be created in the annealing furnace and, hence, if the precursor is prepared by a wet process such as electroplating, the moisture which affects the quality of CIS cannot be thoroughly removed before the selenization reaction.

The apparatus (C) for forming the conventional CIS thin-film layer employs a small ampule as the reaction vessel and, hence, it is suitable for small-scale operation in the laboratory but not adapted to high-volume production on an industrial scale.

SUMMARY OF THE INVENTION

An object of the present invention is to solve these problems of the prior art, namely, to ensure that I-III-VI$_2$ thin-film layers of good quality can be formed efficiently with less energy at lower cost.

According to a first aspect of the invention, the stated object can be attained by an apparatus for forming I-III-VI$_2$ thin-film layers, which has a precursor for forming a I-III-VI$_2$ thin-film layer and a vapor source of an element of group VI of the periodic table placed in a reaction chamber made of a carbon material, said components being heated under vacuum to form the I-III-VI$_2$ thin-film layer, wherein the reaction chamber is divided into a reaction compartment A having said precursor placed therein and a reaction compartment B having said vapor element of group VI placed therein, a communication channel C being provided between the reaction compartments A and B, and wherein heating means controlled by temperature control means is provided exterior to each of the reaction compartments A and B.

According to a second aspect of the invention, in the apparatus of the first aspect, the reaction chamber is divided into a single reaction compartment A and a single reaction compartment B, with a communication channel C being provided between said reaction compartments A and B.

According to a third aspect of the invention, in the apparatus of the first aspect, the reaction chamber is divided into a single reaction compartment A and two or more reaction compartments B, with a communication channel C being provided between the reaction compartment A and each of said two or more reaction compartments B.

According to a fourth aspect of the invention, the object of the invention can also be attained by a method of forming I-III-VI$_2$ thin-film layers under vacuum with an apparatus having a reaction chamber that is made of a carbon material and which is divided into a reaction compartment A having a precursor for forming a I-III-V$_{y2}$ thin-film layer placed therein and a reaction compartment B having a vapor source of an element of group VI of the periodic table placed therein, with a communication channel C being provided between the reaction compartments A and B, and heating means controlled by temperature control means being provided exterior to each of the reaction compartments A and B, wherein the temperatures in the reaction compartments A and B are raised to the point at which a mixed crystal of the element of group VI will form and, subsequently, the temperature in the reaction compartment B is raised to be higher than said temperature for mixed crystal formation such that the vapor of the element of group VI will be adequately supplied from the reaction compartment B through the communication channel C into the reaction compartment A to thereby form the mixed crystal of the element of group VI and, in addition, the temperature in the reaction compartment B is lowered earlier than the temperature in the reaction compartment A such that the element of group VI within the space of the reaction compartment A and the unreacted element of group VI that has been deposited on the surface of the I-III-VI$_2$ thin-film layer are transferred as the vapor of the element of group VI from the reaction compartment A through the communication channel C into the reaction compartment B.

According to a fifth aspect of the invention, in the method of the fourth aspect, the vapor source of an element of group VI of the periodic table is the element of group VI and/or a compound containing said element of group VI.

According to a sixth aspect of the invention, in the method of fourth aspect, the reaction compartment B consists of a plurality of sections, one accommodating the element of group VI of the periodic table and another accommodating a compound containing said element of group VI.

According to a seventh aspect of the invention, in the method of the fourth aspect, the interior of the reaction compartment A is heated to 140 to 250° C. under vacuum prior to the formation of the mixed crystal of the element of group VI such that the moisture in the precursor for forming the I-III-VI$_2$ thin-film layer is thoroughly removed.

The "precursor for forming a I-III-VI$_2$ thin-film layer" which is to be used in the invention is composed of an alloy containing at least a metal of group I and a metal of group III of the periodic table. These metals do not exclude the copresence of a metal of group VI of the periodic table. The precursor may typically be formed by superposing the respective metals.

The "I-III-VI$_2$ thin-film layer" in the invention is formed by producing a mixed crystal of an element of group VI of the periodic table with the precursor for forming a I-III-VI$_2$ thin-film layer. This thin-film layer may typically be composed of CuInSe$_2$, CuInS$_2$, Cu(InGa)Se$_2$, CuIn(SSe)$_2$ and Cu(InGa)S$_2$.

The "vapor source of an element of group VI" which is to be used in the invention is composed of an element of group VI of the periodic table and/or a compound containing said element of group VI, as exemplified by Se, S, SeS, Na$_2$S, Na$_2$(SSe), In$_2$Se$_3$, In$_2$S$_3$ and In$_2$(SSe)$_3$.

In the invention, the temperature in the reaction compartment B need be raised to be higher than the point at which an element of group VI forms a mixed crystal (350 to 600° C.) and it is controlled to be sufficiently high that the vapor of an element of group VI is adequately supplied from the reaction compartment B through communication channel C into the reaction compartment A. For instance, the temperature in the reaction compartment B is controlled to be 50 to 500° C., preferably 100 to 500° C., higher than the point at which the element of group VI forms a mixed crystal.

The compound semiconductor produced by the invention is fabricated into a solar cell by any conventional method, a typical example of which is shown in FIG. 7, i.e., a cadmium sulfide layer is formed on the CIS thin-film layer of the compound semiconductor by either a solution growth or a vacuum evaporation technique and then overlaid with a zinc oxide layer which is formed by sputtering.

BRIEF DESCRIPTION OF THE INVENTION

DETAILED DESCRIPTION OF THE INVENTION

Preferred embodiments of the invention will now be described with reference to the accompanying drawings.

Figure 1:
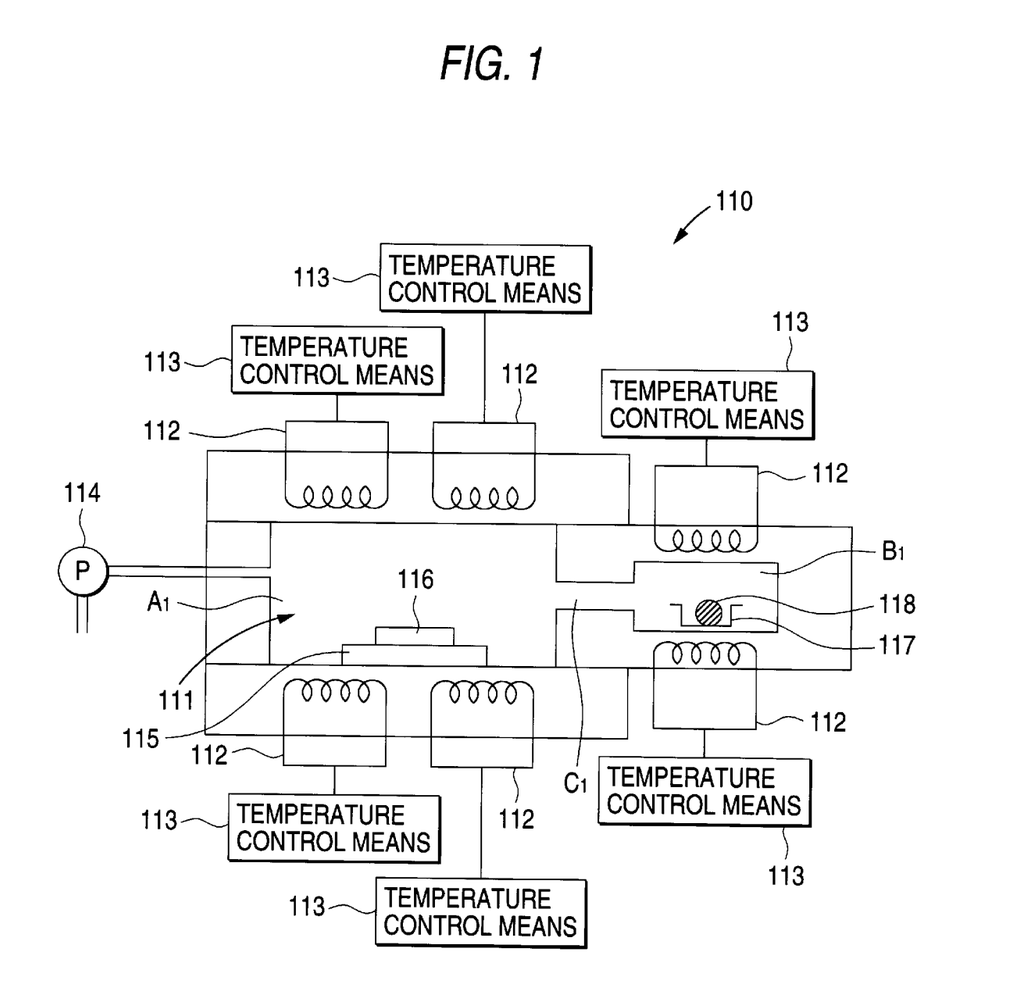
FIG. 1 illustrates an embodiment of an apparatus of the invention for forming I-III-VI$_2$ thin-film layers.
Figure 2:
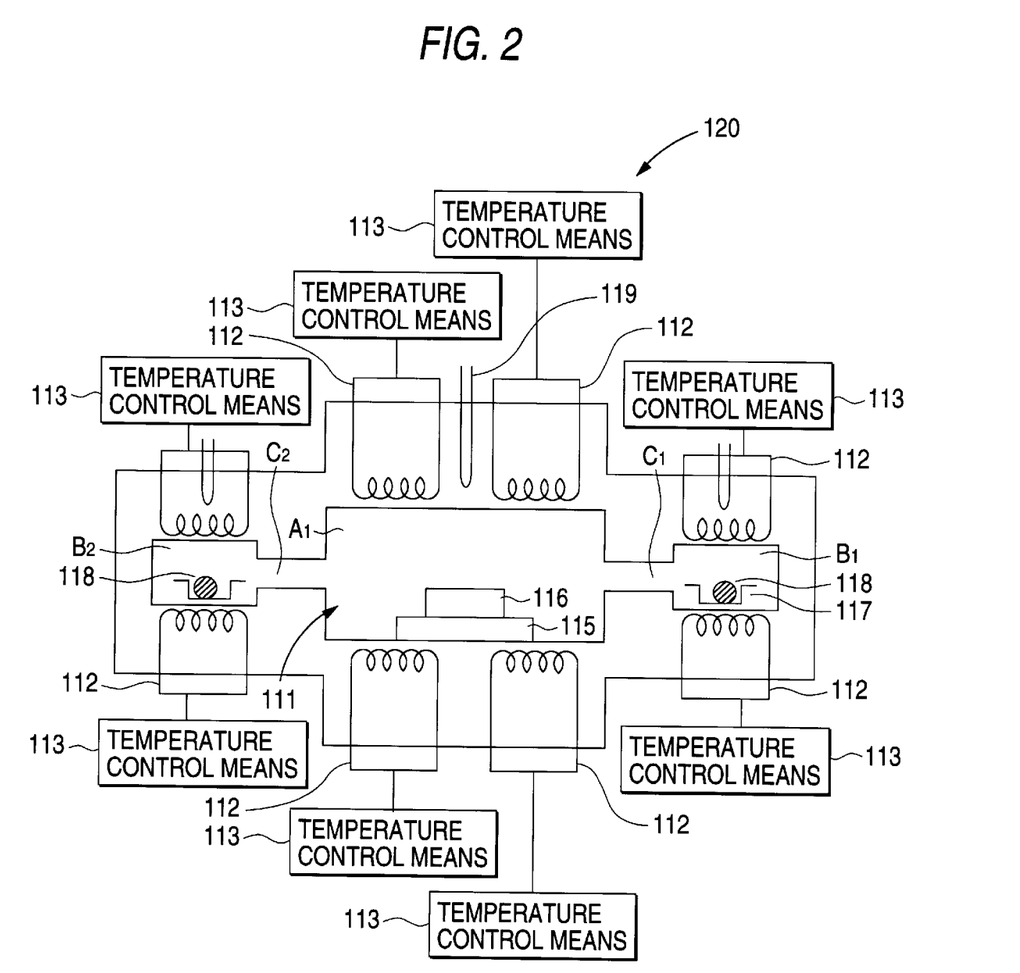
FIG. 2 illustrates another embodiment of an apparatus of the invention for forming I-III-VI$_2$ thin-film layers.
Figure 3:
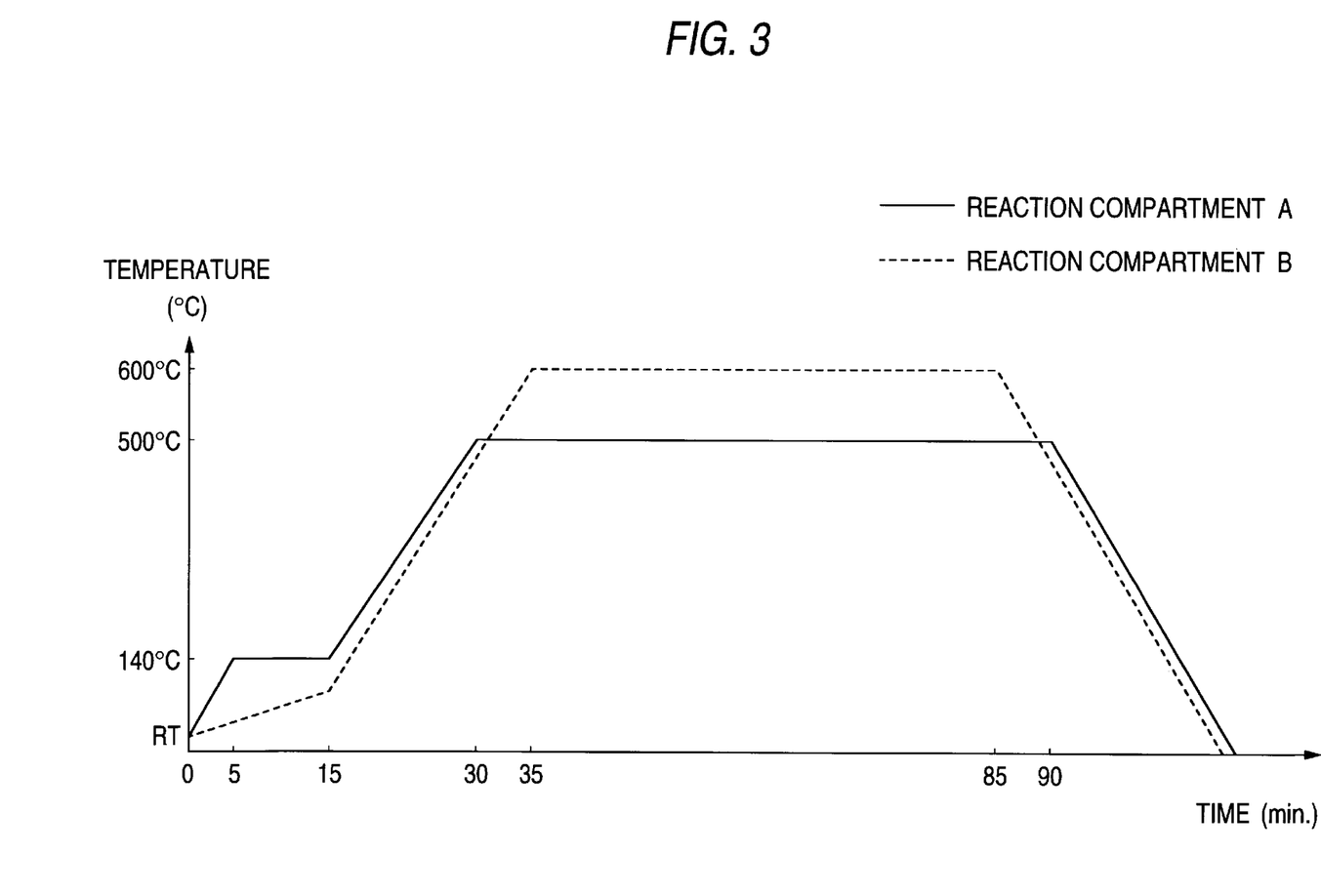
FIG. 3 illustrates an embodiment of a method of the invention for forming I-III-VI$_2$ thin-film layer in connection with the relationship between the heating time and the temperature in each of the reaction compartments A and B.

FIG. 1 illustrates an embodiment of an apparatus for forming I-III-VI$_2$ thin-film layers; FIG. 2 illustrates another embodiment of an apparatus for forming I-III-VI$_2$ thin-film layers; and FIG. 3 illustrates an embodiment of a method of forming I-III-VI$_2$ thin-film layers in connection with the relationship between the heating time and the temperature in each of the reaction compartments A and B.

In FIG. 1, the apparatus for forming a I-III-VI$_2$ thin-film layer is generally indicated by 110 and has a reaction chamber 111, which is divided into a reaction compartment A1 and a reaction compartment B1; a layered structure 116 having a precursor is placed in the reaction compartment A1 and a vapor source 118 of an element of group VI is placed in the reaction compartment B1, and the two reaction compartments communicate with each other by means of a channel C1. Heating means 112 controlled by temperature control means 113 is provided exterior to each of the reaction compartments A1 and B1. The reaction compartment A1 is also provided with a vacuum pump 114 which maintains a vacuum ($10^{-4}$ – $10^{-6}$ Torr) within said reaction compartment. A sample holder 115 is provided in the reaction compartment A1 and the layered structure 116 having a precursor is placed on the holder 115. A tray 117 is placed in the reaction compartment B1 and the vapor source 118 of an element of group VI is placed in the tray 117.

In FIG. 2, another apparatus for forming a I-III-VI$_2$ thin-film layer is indicated by 120 and has a reaction chamber 111, which is divided into a single reaction compartment A1 and two reaction compartments B1 and B2, with the reaction compartment A1 communicating with the reaction compartments B1 and B2 by means of two channels C1 and C2, respectively. Heating means controlled by temperature control means is provided exterior to each of the three reaction compartments A1, B1 and B2. Shown by 119 is a thermocouple.

EXAMPLE 1

A thin-film layer of CIS (CuInSe$_2$) was formed by the following procedure using the apparatus shown in FIG. 1 on the basis of the relationship between the heating time and the temperature in each of the reaction compartments A and B.

In the next step, the interior of the reaction compartments A1 and B1 was heated by the heating means 112 up to 500° C., which was a preset temperature for the generation of a Se mixed crystal (i.e., selenization temperature). With the temperature in the reaction compartment A1 maintained at 500° C., the interior of the reaction compartment B1 was heated to a temperature which was 100° C. higher than the temperature in the reaction compartment A1; that temperature was maintained for 50 min such that the Se vapor generated in the reaction compartment B1 was adequately supplied into the reaction compartment A1 through the communication channel C1. The temperature in the reaction compartment A1 was maintained at 500° C. for 1 hour. The dewatered precursor experienced a satisfactory progress of selenization, or a reaction for the formation of a mixed crystal with Se, under the condition just described above.

Subsequently, the temperature in the reaction compartment B1 was lowered earlier than the temperature in the reaction compartment A1 such that the Se within the space of the reaction compartment A1 and the unreacted Se deposited on the surface of the CIS thin-film layer were transferred as a Se vapor from the reaction compartment A1 through the communication channel C1 into the reaction compartment B1, where they were re-deposited in the reaction compartment B1. Thereafter, the temperature in the reaction compartment A1 was lowered to yield a compound semiconductor having the CIS thin-film layer.

As described in connection with the prior art (FIG. 7), a CdS layer was deposited on the CIS thin-film layer of the compound semiconductor by vacuum evaporation and a ZnO layer was then deposited on the CdS layer by sputtering to fabricate a solar cell.

Comparative Example 1

A CIS thin-film layer 6 (see FIG. 4(c)) was formed using the conventional apparatus shown in FIG. 5 and it was overlaid with a CdS layer 7 by vacuum evaporation, which in turn was overlaid with a ZnO layer 8 by sputtering to fabricate a solar cell (see FIG. 7).

EXAMPLE 2

A thin-film layer of $CuInS_2$ was formed by the following procedure using the apparatus for forming $I-III-VI_2$ thin-film layers shown in FIG. 1.

First, the vacuum pump 114 was operated to create a vacuum in both the reaction compartment A1 and the reaction compartment B1. A layered structure 116 having a Cu/In precursor as shown in the prior art (FIG. 4) was placed in the reaction compartment A1 and a solid S 118 was placed in the reaction compartment B1. With the vacuum maintained, the interior of the reaction compartment A1 was heated by the heating means 112 to gradually increase the temperature in the reaction compartment A1; when a temperature of 140° C. was reached, it was maintained for 10 min until the moisture was fully removed from the precursor. In the meantime, the interior of the reaction compartment B1 was slowly heated by residual heat.

In the next step, the interior of the reaction compartments A1 and B1 was heated by the heating means 112 up to 550° C., which was a preset temperature for the generation of a S mixed crystal (i.e., sulfurization temperature). With the temperature in the reaction compartment A1 maintained at 550° C., the interior of the reaction compartment B1 was heated to a temperature which was 100° C. higher than the temperature in the reaction compartment A1; that temperature was maintained for 50 min such that the S vapor generated in the reaction compartment B1 was adequately supplied into the reaction compartment A1 through the communication channel C1. The temperature in the reaction compartment A1 was maintained at 550° C. for 1 hour. The dewatered precursor experienced a satisfactory progress of sulfurization, or a reaction for the formation of a mixed crystal with S, under the conditions just described above. Thereafter, as in Example 1, the reaction compartments A1 and B1 were cooled to yield a compound semiconductor having a thin-film layer of $CuInS_2$ and a solar cell was fabricated from this compound semiconductor.

EXAMPLE 3

A thin-film layer of $CuIn(SSe)_2$ was formed by the following procedure using the apparatus shown in FIG. 2.

First, a vacuum pump (not shown) was operated to create a vacuum in the reaction compartment A1, as well as in the reaction compartments B1 and B2. A layered structure 116 having a Cu/In precursor formed by vacuum evaporation was placed in the reaction compartment A1; a solid Se was placed in the reaction compartment B1; and a solid $Na_2S$ was placed in the reaction compartment B2. With the vacuum maintained, the interior of each reaction compartment was heated by the associated heating means 112 up to a preset temperature of 500° C. With the temperature in the reaction compartment A1 maintained at 500° C., the interior of the reaction compartments B1 and B2 was heated up to a temperature which was 100° C. higher than the temperature in the reaction compartment A1; that temperature was maintained for 50 min such that the Se vapor generated in the reaction compartment B1 and the Na and S vapors generated in the reaction compartment B2 were adequately supplied into the reaction compartment A1 through the communication channels C1 and C2, respectively. The precursor experienced a satisfactory progress of selenization and sulfurization, or reactions for the formation of mixed crystals with Se and S, under the conditions just described above. Thereafter, as in Example 1, the reaction compartments A1, B1 and B2 were cooled to yield a compound semiconductor having a thin-film layer of $CuIn(SSe)_2$ and a solar cell was fabricated from this compound semiconductor.

EXAMPLE 4

A thin-film layer of $CuIn(SSe)_2$ was formed by the following procedure using the apparatus shown in FIG. 2.

First, a vacuum pump (not shown) was operated to create a vacuum in the reaction compartment A1, as well as in the reaction compartments B1 and B2. A layered structure 116 having a Cu/In precursor formed by vacuum evaporation was placed in the reaction compartment A1; a solid Se was placed in the reaction compartment B1; and solid S was placed in the reaction compartment B2. With the vacuum maintained, the interior of each reaction compartment was heated by the heating means 112 up to a preset temperature of 550° C. With the temperature in the reaction compartment A1 maintained at 550° C., the interior of the heating compartments B1 and B2 was heated up to a temperature which was 100° C. higher than the temperature in the reaction compartment A1; that temperature was maintained for 50 min such that the Se vapor generated in the reaction compartment B1 and the S vapor generated in the reaction compartment B2 were adequately supplied into the reaction compartment A1 through the communication channels C1 and C2, respectively. The temperature in the reaction compartment A1 was maintained at 550° C. for 1 hour. The precursor experienced a satisfactory progress of selenization and sulfurization, or reactions for the formation of mixed crystals with Se and S, under the conditions just described above. Thereafter, as in Example 1, the reaction compartments A1, B1 and B2 were cooled to yield a compound semiconductor having a thin-film layer of $CuIn(SSe)_2$ and a solar cell was fabricated from this compound semiconductor.

EXAMPLE 5

A thin-film layer of $Cu(InGa)Se_2$ was formed by the following procedure using the apparatus shown in FIG. 1.

First, a glass/Mo substrate was successively overlaid with Ga-containing Cu and In by sputtering to form a layered structure having a Cu(Ga)/In precursor. Subsequently, the vacuum pump 114 was operated to create a vacuum in both the reaction compartment A1 and the reaction compartment B1. The layered structure 116 having a Cu(Ga)/In precursor was placed in the reaction compartment A1 and a solid Se 118 was placed in the reaction compartment B1. With the vacuum maintained, the interior of each reaction compartment was heated by the associated heating means 112 up to a preset temperature of 500° C. With the temperature in the reaction compartment A1 maintained at 500° C., the interior of the reaction compartment B1 was heated to a temperature which was 100° C. higher than the temperature in the reaction compartment A1; that temperature was maintained for 50 min such that the Se vapor generated in the reaction compartment B1 was adequately supplied into the reaction compartment A1 through the communication channel C1. The interior of the reaction compartment A1 was maintained at 500° C. for 1 hour. The precursor experienced a satisfactory progress of selenization, or a reaction for the formation of a mixed crystal with Se, under the conditions just described above. Thereafter, as in Example 1, the reaction compartments A1 and B1 were cooled to yield a compound semiconductor having a thin-film layer of $Cu(InGa)Se_2$ and a solar cell was fabricated from this compound semiconductor.

EXAMPLE 6

A thin-film layer of $CuInSe_2$ was formed by the following procedure using the apparatus shown in FIG. 2.

First, a glass/Mo substrate was overlaid with Cu by vacuum evaporation. The resulting layered structure having a thin-film Cu layer, a solid Se and $In_2Se_3$ were placed in the reaction compartments A1, B1 and B2, respectively. A vacuum pump (not shown) was operated to create a vacuum in each reaction compartment. With the vacuum maintained, the interior of the reaction compartment A1 was gradually heated; when a temperature of 200° C. was reached, it was maintained for 30 min. Then, with the vacuum maintained, the interior of the reaction compartment B2 was heated to raise the temperature up to 600° C. which was high enough to form a precursor having an $In_xSe_y$ film deposited on the thin-film Cu layer. Subsequently, with the vacuum maintained, the interior of the reaction compartments A1 and B1 was heated by the heating means 112 to a preset temperature of 500° C.

With the temperature in the reaction compartment A1 maintained at 500° C., the interior of the reaction compartment B1 was heated to a temperature which was 100° C. higher than the temperature in the reaction compartment A1; that temperature was maintained for 50 min such that the Se vapor generated in the reaction compartment B1 was adequately supplied into the reaction compartment A1 through the communication channel C1. The interior of the reaction compartment A1 was maintained at 500° C. for 1 hour. The precursor experienced a satisfactory progress of selenization, or a reaction for the formation of a mixed crystal with Se, under the conditions just described above. Thereafter, as in Example 1, the reaction compartments A1, B1 and B2 were cooled to yield a compound semiconductor having a thin-film layer of $CuInSe_2$ and a solar cell was fabricated from this compound semiconductor.

Figure 8:
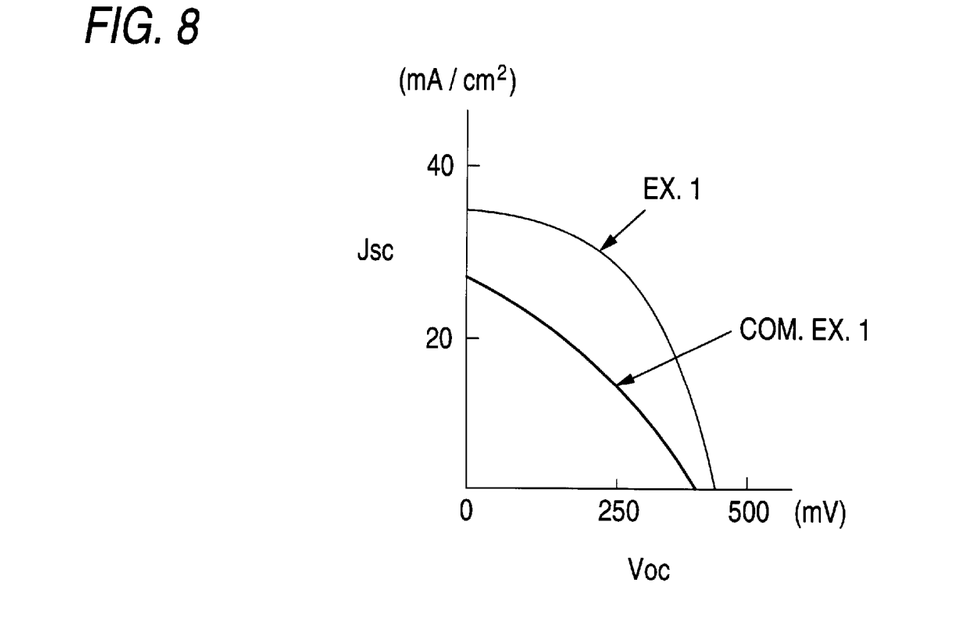
FIG. 8 is a graph showing the I-V characteristics of solar cells fabricated from the I-III-VI$_2$ thin-film layers formed in accordance with the present invention and with the prior art.

The solar cells fabricated in Example 1 and Comparative Example 1 had the I-V characteristics shown in FIG. 8. The devices fabricated in Examples 1 to 6 and Comparative Example 1 had the open-circuit voltages ($V_{oc}$), short-circuit photocurrents ($J_{sc}$), curve factors (FF) and conversion efficiencies ($\eta$) which are listed in Table 1 below. As is clear from FIG. 8 and Table 1, the solar cells fabricated in accordance with the present invention are improved in all characteristics of interest as compared with the prior art device.

TABLE 1

|  | $V_{OC}$ (mV) | $J_{SC}$ (mA/cm$^2$) | FF | $\eta$ (%) |
| --- | --- | --- | --- | --- |
| Example 1 | 380 | 32 | 0.5 | 6.08 |
| Example 2 | 420 | 26 | 0.52 | 5.68 |
| Example 3 | 380 | 33 | 0.51 | 6.40 |
| Example 4 | 420 | 30 | 0.55 | 6.93 |
| Example 5 | 400 | 30 | 0.51 | 6.12 |
| Example 6 | 380 | 31 | 0.49 | 5.77 |
| Comparative Example 1 | 235 | 28 | 0.35 | 3.28 |

(1) In the apparatus of the invention for forming I-III-VI$_2$ thin-film layers, a precursor for forming a I-III-VI$_2$ thin-film layer and a vapor source of an element of group VI of the periodic table are placed in a reaction chamber made of a carbon material and said components are heated under vacuum to form the I-III-VI$_2$ thin-film layer. The apparatus is characterized in that the reaction chamber is divided into a reaction compartment A having said precursor placed therein and a reaction compartment B having said vapor element of group IV placed therein, that a communication channel C is provided between the reaction compartments A and B and that heating means controlled by temperature control means is provided exterior to each of the reaction compartments A and B. By said heating means, the temperature in each of the reaction compartments A and B is raised to the temperature at which a mixed crystal of the element of group VI is formed; subsequently, the temperature in the reaction compartment B is raised to be higher than the temperature for mixed crystal formation to thereby create a sufficient temperature difference between the precursor for forming the I-III-VI$_2$ thin-film layer and the vapor source of the element of group VI that the vapor of the element of group VI is adequately supplied from the reaction compartment B through the communication channel C into the reaction compartment A, thereby ensuring that the mixed crystal of the element of group VI is formed rapidly.

(2) According to the invention, the temperature in the reaction compartment B is raised earlier than the temperature in the reaction compartment A such that the element of group VI within the space of the reaction compartment A and the excess of the element of group VI deposited on the surface of the thin I-III-VI$_2$ film are transferred as the vapor of said element from the reaction compartment A through the communication channel C into the reaction compartment B; this is effective not only in establishing a clean condition within the reaction compartment A but also in increasing the operating efficiency by recycling the unreacted element of group VI which has been redeposited in the reaction compartment B.

(3) Another feature of the invention is that prior to the formation of a mixed crystal with the element of group VI, the interior of the reaction compartment A is heated to 140 to 250° C. under vacuum to ensure that the moisture in the precursor for forming a I-III-VI$_2$ thin-film layer which has typically been prepared by a wet process is fully removed; this helps to improve the I-V characteristic, conversion efficiency and other performance parameters of the solar cell that is fabricated from a compound semiconductor having the thus formed I-III-V$_{,2}$ thin-film layer. In addition, the reaction chamber of the apparatus of the invention is made of a carbon material such as graphite and this effectively prevents the reaction that would otherwise occur between the element of group VI and the constituent material of the reaction chamber.

As described above, the present invention not only permits rapid formation of a mixed crystal with an element of group VI of the periodic table but also enables the recycling of the element of group VI and a compound containing such element while reducing their consumption; because of these and other advantages, I-III-VI$_2$ thin-film layers of good quality can be formed efficiently with less energy at lower cost. As a further advantage, the vacuum created in the reaction chamber provides for adequate removal of moisture from the precursor and this enables the formation of high-quality I-III-VI$_2$ thin-film layers which contribute to the fabrication of solar cells having improved I-V characteristics, conversion efficiencies, etc.

What is claimed is:

1. A method of forming I-III-VI$_2$ thin-film layers under vacuum with an apparatus having a reaction chamber which is made of a carbon material and which is divided into a first reaction compartment having a precursor for forming a I-III-VI$_2$ thin-film layer placed therein and a second reaction compartment having a vapor source of an element of group VI of the periodic table placed therein, a communication channel being provided between the first and second reaction compartments, and heating means controlled by temperature control means and provided exterior to each of the first and second reaction compartments, the method comprising the steps of:

raising temperatures in the first reaction compartment and the second reaction compartment to the mixed crystal temperature, the point at which a mixed crystal of the element of group VI will be produced;

raising temperature in the second reaction compartment to be higher than the mixed crystal temperature such that a vapor of the element of group VI will be adequately supplied from the second reaction compartment through the communication channel into the first reaction compartment to thereby form the mixed crystal of the element of group VI; and lowering temperature in the second reaction compartment earlier than temperature in the first reaction compartment such that the element of group VI within a space of the first reaction compartment and the unreacted element of group VI that has been deposited on a surface of the I-III-VI$_2$ thin-film layer are transferred as a vapor of the element of group VI from the first reaction compartment through the communication channel into the second reaction compartment.

2. A method according to claim 1, wherein the vapor source of an element of group VI of the periodic table is a material selected from the group consisting of the elements of group VI and compounds containing the elements of group VI.

3. A method according to claim 1, wherein the second reaction compartment consists of two sections, one accommodating a material selected from the group consisting of the elements of group VI and compounds containing the elements of group VI, and the other accommodating a material selected from the group consisting of the elements of group VI and compounds containing the elements of group VI.

4. A method according to claim 1, wherein an interior of the first reaction compartment is heated to 140 to 250° C. under vacuum prior to the formation of the mixed crystal of the element of group VI such that moisture in the precursor for forming the I-III-VI$_2$ thin-film layer is thoroughly removed.

* * * * *